United States Patent [19]

Crouse

[11] 4,095,218
[45] June 13, 1978

[54] HYBRID PULSE WIDTH-PULSE RATE DIGITAL-TO-ANALOG CONVERTER METHOD AND APPARATUS

[75] Inventor: William George Crouse, Raleigh, N.C.

[73] Assignee: International Business Machines Corporation, Armonk, N.Y.

[21] Appl. No.: 718,728

[22] Filed: Aug. 30, 1976

[51] Int. Cl.² ............................................. H03K 13/02
[52] U.S. Cl. .......................... 340/347 DA; 340/347 M; 328/111
[58] Field of Search ................... 340/347 M, 347 DA; 328/111

[56] References Cited
U.S. PATENT DOCUMENTS

| | | | |
|---|---|---|---|
| 3,603,977 | 9/1971 | Szabo et al. | 340/347 M |
| 3,754,233 | 8/1973 | Sutherland | 340/347 DA |
| 3,942,171 | 3/1976 | Haraszti et al. | 340/347 DA |

*Primary Examiner*—Thomas J. Sloyan

*Attorney, Agent, or Firm*—E. H. Duffield

[57] ABSTRACT

A digital-to-analog converter method and apparatus is disclosed which utilizes a hybrid technique of combined pulse width and pulse rate modulation to achieve improved performance with reduced logic and circuitry requirements. Lower order bits of an N-bit digital data input for conversion to a corresponding analog output voltage level are treated in a manner similar to pulse rate modulation approaches utilized previously. High order bits are handled together in a variant form of pulse width (duration) modulation in which the pulse width required to generate the given analog voltage level corresponding to the high order digital bit inputs is divided into a fixed number of slices in a given sample time, each slice having a width or duration of pulse output which is variable in itself in correspondence to a function of both the high and low order bit value inputs. A low pass filter or integrator combines all of the pulses in a given sample to produce the analog voltage level output.

9 Claims, 6 Drawing Figures

HYBRID PULSE WIDTH-PULSE RATE DIGITAL-TO-ANALOG CONVERTER METHOD AND APPARATUS

FIELD OF THE INVENTION

This invention relates to indirect digital-to-analog converter apparatus and methods in general and, in particular, it relates to pulse width and pulse rate combination hybrid modulation techniques.

PRIOR ART

A good many prior art approaches for indirect digital-to-analog converters are well known. For example, digital-to-analog conversion can be achieved by utilizing pulse duration modulation (pulse width modulation) or by pulse rate modulation techniques. U.S. Pat. No. 3,603,977 shows a typical pulse duration modulation technique and *Electronic Design*, Vol. 22, Oct. 24, 1968, pages 70–77, shows a pulse rate modulation technique. Also, U.S. Pat. No. 3,707,713 illustrates a pulse rate modulation technique as does U.S. Pat. No. 3,110,894. Other pulse width modulation techniques are shown in U.S. Pat. Nos. 3,447,149 and in 3,422,423 and another form of pulse frequency modulation or pulse rate modulation is shown in U.S. Pat. No. 2,907,021.

A hybrid pulse width modulation technique in which multiple pulses within a given sample time may be pulse width modulated is shown in U.S. Pat. No. 3,576,575. Yet another hybrid technique is illustrated in U.S. Pat. No. 3,754,233 in which a form of pulse width modulation is utilized for the low order bits and pulse rate modulation techniques are applied to the high order bits of a digital data input intended for conversion.

It is desired to achieve improved performance in a highly digital implementation which can be optimized for large scale integrated circuit applications. This is especially desirable in the event that many digital-to-analog converters will be required in a given unit such as, for example, voice handling facilities for earth satellite digital voice transmission systems and public exchanges.

The difficulties with the various types of prior art approaches are generally well known. For example, pulse width modulation requires a digitally controlled pulse generator to output a bilevel pulse or pulses during each sample time so that the duty cycle over the sample time yields an average voltage that is proportional to the digital data input for that sample time. The spectrum of the transmitted energy utilizing this modulation technique consists of a low frequency spectrum portion which is the desired signal and a similar spectrum wrapped around the sampling frequency utilized plus additional noise caused by the binary nature of the digital output waveform. This louder noise spectrum is a penalty of using a simple binary, i.e., two voltage level pulse generator or current generator. This noise component can be modified depending upon the specific nature of the digital waveform to be sent. However, a low pass filter will be required to remove the unwanted portion of the total spectrum in such approaches and the noise spectrum thus present can place very great demands on accurate and high tolerance components in the filter. This is an expense and degree of precision that would be desirably avoided if possible.

Another difficulty with the typical pulse width modulation approach is that the output consists of a single pulse per sample with a starting time generally at the beginning of that sample and lasting for a period of time proportional to the data bit input. This approach has as a disadvantage the aspect that the effective center of the sample output energy is at the center of the output pulse. Thus, for a small number such as 1, the output energy is centered at the left-hand or early edge of the sample time while, for larger numbers, the centers approach the center of the sample time. This can be a significant degree of distortion if the sampling rate is not high compared to the signal frequency used. The high amplitudes generally connoted by high digital numbers are often reconstructed with a greater delay, as just discussed, and thus the analog wave is distorted more at higher voltage levels than at low voltages. Also, a regular sampling rate, when reconstructed in this manner, becomes irregular and this represents a form of frequency distortion as well as amplitude distortion.

An approach which solves part of the foregoing problem for pulse width modulation is to provide a pulse which is centered in the center of the sample time and which grows both earlier and later at its edges to extend the pulse to generate the analog for larger numbers. This improvement in function is obtained at the expense of a more sophisticated amount of implementation hardware requiring perhaps twice the circuitry and ideally at least twice the count rate in the counters used for generating the output pulses. This is an additional expense which it would be desirable to avoid.

A very major difficulty with both forms of pulse width modulation approaches is that they each have an output energy spectrum with a strong noise component at the sampling rate. The problem is well known and is obvious if one considers the waveform which will appear when a pulse width happens to be equal to one half of the sampling time utilized. Here the pulse generator output will be a square wave with a peak-to-peak amplitude equal to the full dynamic range of the converter output and at a frequency equal to the sampling frequency.

As the input data varies the pulse width, the output spectrum and its energy will vary, but the net result is that a great deal of energy at the sampling frequency will appear in the spectrum. This places a very great demand on a low pass filter to separate the noise from the desired portion of the signal and still pass the fundamental pulse rate or signal frequency that is desired. Such filters are usually expensive, technically more complex, and require tighter component value tolerances, all at additional cost and complexity which would be desirably avoided.

Another prior art approach, other than the two above, is known as the pulse rate modulation technique described in U.S. Pat. No. 3,707,713, for example. Here, each data input bit, if zero, inhibits the formation of a pulse train having a number of pulses equal to the digital binary value of that bit which pulse train will be evenly distributed across the sample time. The pulses in each train corresponding to each digital bit value are so arranged as to not coincide with the pulses from any other train. Thus the output series of pulses will consist of a number of discrete pulses which will equal the value of the binary input data. Pulse rate modulation places very little demand upon the low pass filter utilized to reconstruct the analog waveform because its noise spectrum places the noise components of the energy farther out in frequency at a place where the energy, even though it may be relatively great, can be easily filtered out with a simple one pole filter.

For this technique, the following example will show the effect on filter requirements. The low order digital bit yields a very small amount of energy at the sampling frequency—for example, one very narrow pulse in the center of the sample time, whereas the second bit yields twice the energy of the first bit, but at twice the frequency; the third bit yields four times the energy of the first bit, but at four times the frequency, etc. This type of modulation technique can produce a very linear conversion where each pulse has the same energy. If each pulse is to have the same energy, however, it will be necessary that all pulses are separated cleanly from one another and that their rise, fall and duration times be exactly the same. This requires approximately twice the switching speed at the output as earlier single pulse per sample time techniques such as the pulse duration technique. As the result of this fact, the absolute conversion accuracy could be quite poor unless very high switching speeds with accurate transitions between rise and fall can be achieved. These factors are a function of component parameters, temperature, power supply and design, and other factors, which greatly increase the cost of packaging and producing converters utilizing this technique.

Various hybrid techniques, as referred to earlier above are available, but these also entail additional expense and/or technical difficulties which increase the cost of achieving better performance. For example, utilizing a multiple pulse, pulse width modulation technique where $n$ pulses of a given width are generated during a sample time requires higher clock frequencies and better noise filters, in terms of function and design and requires generally the highest resolution rise and fall times in the clocking circuits which are costly to produce and difficult to stabilize for temperature. Likewise, the hybrid technique in which pulse width modulation may be applied to some of the low order data bits while pulse rate modulation techniques are applied to the high order data bit inputs achieves better performance than pulse width modulation alone, but still requires a better grade of filter than pulse rate modulation alone and requires higher switching speeds at the output, all of which entails additional expense and difficulty of construction.

In light of the foregoing and still other difficulties not mentioned in the prior art, the objects of this invention are as follows:

OBJECTS OF THE INVENTION

It is an object of this invention to achieve improved digital-to-analog conversion suitable for use in large scale integrated circuitry and requiring a minimum of logic and filtering capacity in a new and improved manner.

Another object of this invention is to provide an improved hybrid digital-to-analog conversion method.

Yet another object of this invention is to provide an improved digital-to-analog converter circuit which utilizes a minimum of logic and memory and is suitable for high density, low cost packaging techniques.

SUMMARY

The foregoing, and still other objects of the invention not enumerated, are met in providing a hybrid digital-to-analog conversion method in which low order digital data bits are handled essentially in the manner of pulse rate modulation techniques and that high order digital data input bits are handled as a multiple pulse, pulse width technique would dictate. A fixed number of pulses, for example 8 pulses, are generated equally spaced across the sample time of a given digital sample to be transmitted. Each pulse has a minimum pulse width which includes a full rise and fall time for a pulse in a manner similar to one unit of time or a unit cycle of a high speed electronic clock. Each pulse width can be increased from its minimum by a number of time units defined as follows:

FORMULA 1

$$2^B/n = N$$

where $B$ equals the number of data bits in the input, $n$ equals the number of pulses per sample time, and $N$ equals the number of time units by which each pulse width can be increased. Each pulse will be separated by a minimum time from the adjacent pulse which is sufficient to allow for a full rise and fall for all pulses. Each pulse within a single sample time can be increased from its minimum size by an amount dictated by the most significant (high order) bits defined by the following equation:

FORMULA 2

$$B - \log_2 n = MSB \text{ (Most Significant Bit)}$$

Each pulse that can be so increased will have its width increased by $\frac{1}{8}$ (for example) of its binary weight value, i.e., since 8 pulses, for example, are used in a given sample time, energy will be added by extending each of the 8 pulses by a binary amount necessary to generate the desired analog output defined by the following equation:

FORMULA 3

High order bit pulse width increase = $2^{m-1}/n$ for each sub-sample or slice where $m$ is a high order bit 4, 5, 6, etc., as defined in formula 2, and is in the data input with 4 being the least significant high order bit in the chosen example and $n$ is defined as previously.

In addition, each pulse in the sample can be increased by one unit of width as dictated by each of the least significant bits (1, 2, 3 in the example chosen) so that, in general, if more or fewer pulses (sub-samples) are utilized in a given sample, the most significant of the low order bits (B-MSB) controls the incrementing of every other pulse where the total number of pulses in the sample is equal to $n$.

The sum of all of the pulse widths within a given sample time may be measured and averaged over the sample time and the average will change precisely with the input data bits. For the high order bits, this approach provides similar performance to pulse width modulation techniques but, since the energy is distributed fractionally among each pulse within the sample time, no increase in circuit speeds or counting speeds is required. The insertion of energy for the low order bits is similar to the performance provided by pulse rate modulation techniques except that it does not require additional rise and fall times and does not demand an increase in switching speeds or abilities. The noise spectrum for this technique up to $(\frac{1}{2})n$ times the sampling frequency is very much like that of the pulse rate modulation approach. However, at $n$ times the sample frequency, the amount of energy distributed in the noise spectrum is better provided for than in the pulse width modulation approach. The filter requirements, although slightly greater than that for pulse rate modulation techniques alone, are greatly reduced and a simple one pole filter can be utilized. The linearity of this conversion technique and method is at least as good as that of the pulse rate modulation approach and can be made nearly prefect with very little additional effort. The absolute conversion accuracy is far better than for pulse rate modulation techniques for any practical case where speed is of concern and is nearly perfect when the pulse amplitude and offset are carefully maintained.

BRIEF DESCRIPTION OF DRAWINGS

The foregoing and other objects are met as will be illustrated with reference to a preferred embodiment described in the following specification of which.

DETAILED SPECIFICATION

The following is a description of a digital-to-analog converter in a preferred embodiment thereof according to the present invention, together with the novel method of modulation employed.

Figure 1:
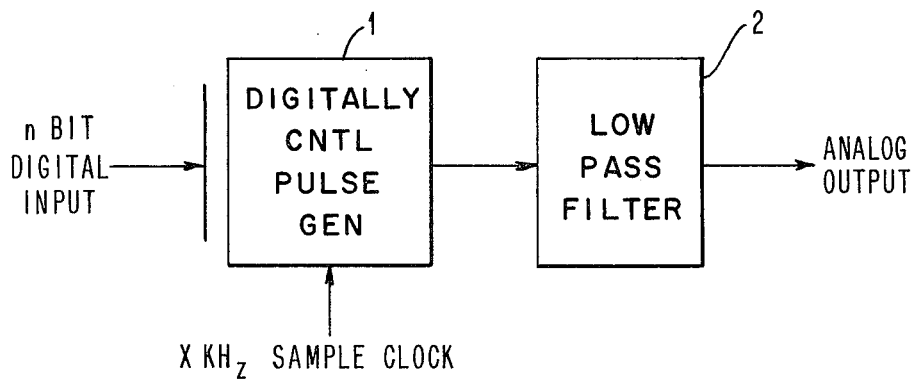
FIG. 1 illustrates a typical schematic embodiment of prior art digital-to-analog converter apparatus.

Turning to FIG. 1, the basic block diagram for a digital-to-analog converter using pulse width or pulse rate modulation techniques to perform the conversion is shown. This device represents in a block diagram the general approach taken in this and in prior art devices for constructing the over-all converter itself. The digitally controlled pulse generator 1 is supplied with an N-bit digital input which represents a digital encoding of the value of an instantaneous value of an analog waveform that is to be reconstructed. The pulse generator 1 also receives input at a rate of $x$ kilohertz from a sample clock (not shown). The output of the digitally controlled pulse generator 1 is a bilevel pulse or pulses which occur during each cycle of the sample clock so that the duty cycle of the sampling waveform yields an average analog voltage output proportional to the digital input for a given sample.

This output is applied at the input of a low pass filter 2 or an integrator which results in reconstructing an analog waveform as is well known in the prior art. As previously discussed, the design of the filter 2 is of primary importance in reducing the expense and complexity of the converter circuits and of the internal construction of the digitally controlled pulse generator 1 and of the sample clock, not shown. All of these are significant since the switching speeds required, etc,. may entail additional expense and complexity as noted above.

Figure 2:
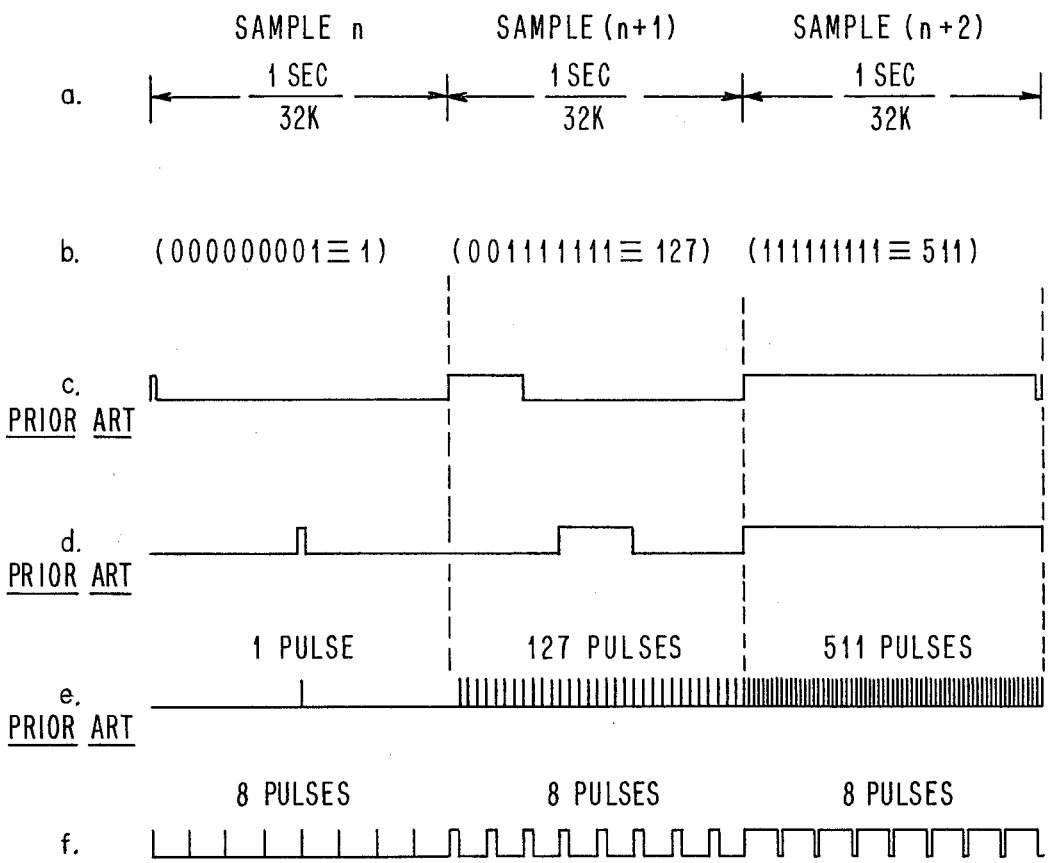
FIG. 2 illustrates a schematic diagram of several prior art modulation techniques in contrast with the hybrid modulation technique of the present invention.

FIG. 2 illustrates in a schematic fashion some of the possible output waveforms that could come from four different types of digitally controlled pulse generators of the general type such as shown in FIG. 1. Line A illustrates three consecutive sample times for a given sampling rate. The sampling rate chosen in the example is a 32 kilohertz sampling clock so that each sample time measures 1 second divided by 32 thousand. Line B illustrates a bit pattern for an assumed 9 bit sample value to be converted. The base 10 equivalent of the 9 bit data patterns are also shown. Lines C, D and E illustrate state of the art output waveforms and Line F illustrates, in a simplified manner, the waveform produced by the present invention.

In FIG. 2, Line C is a typical type of waveform provided by what is probably the simplest type of pulse width digital-to-analog converter. Its output consists of one pulse per sample time starting at the beginning of the sample time and lasting for a period of time proportional to the data bit value input. This function is typically provided by incrementing a presettable counter in which the input data are set into a counter which has the same number of binary counting stages as the number of data bits input. Then the counter is clocked at a constant frequency until the count returns to zero. The output, which is generally provided by a high speed electronic switch controlled by the counter, is held on during the counting time and thus the output pulse width is equal to the data input count multiplied times the period of the clock frequency utilized to count down the counter. This type of function has as a disadvantage the effect that the center of the sample output energy is at the center of the output pulse. Thus a small number, such as a digital 1 illustrated in the first sample time at the left of Line C, has its center near the left-hand edge of the sample time. Larger numbers, such as 127 or 511, illustrated consecutively to the right of the first sample time in Line C, will have centers which are removed progressively closer to the center of the sample time itself. As noted previously, this can be a significant type of distortion if the sampling rate is not very high compared to the signal frequency utilized.

FIG. 2, Line D illustrates the output of a digital-to-analog converter which solves a portion of the problem inherent in the basic pulse width technique just referred to. In Line D, the pulse width modulation pulse is centered at the center of each sample time so that the leading edge grows earlier and the trailing edge is extended later, in equal amounts, for progressively larger numbers. An improvement in function is obtained by this method but at the expense of a much more costly implementation requiring twice the circuitry and perhaps twice the count rate in the counters which are utilized to control the electronic switch generating the output pulse. The difficulties with the noise spectrum inherent in the approaches illustrated in Lines C and D have already been detailed above.

FIG. 2, Line E illustrates in a crude fashion the output of a digital pulse generator utilizing the pulse rate modulation technique. Here, each input bit is utilized to control the generation of a string of one or more pulses which are distributed evenly across the sample time in a manner such that each individual input bit in the data sample will control the generation of a pulse train which is distributed so as not to coincide with any of the pulses from any other data bit pulse train. Thus the output consists of a number of discrete pulses which, when combined, equal the value of the input data.

FIG. 2, Line F illustrates in a very simplified form the waveform of the present invention which combines the advantages of the pulse rate modulation technique with those of the pulse width modulation technique.

In FIG. 2, Line F, a fixed number of pulses, for example 8 in the preferred embodiment, are generated in the digitally controlled pulse generator such as 1 in FIG. 1. These pulses are equally spaced across a given sample time. This description for the preferred embodiment will assume an example of a 9 bit converter operating at a sampling rate of 32 kilohertz and utilizing 8 pulses per conversion time or sample time. Each pulse will have a minimum pulse width which includes the full rise and fall time of a pulse and defines one time unit or cycle of a high speed clock, not illustrated. Each pulse width of the 8 pulses in the sample time can be increased from its minimum width by at least $2^B/n$ time units as defined by Formula 1 above. Furthermore, each full duration pulse will be separated by a minimum sufficient time from any adjacent sub-sample's pulse to allow the full rise and fall of all pulses and to prevent overlap thereof. Each pulse within a single sub-sample time can be increased from its minimum width by an amount dictated by the $B - \log_2 n$ most significant bit as defined in Formula 2 above in a manner such that each of these bits at the data input, if equal to a 1, will increase the pulse's width by $\frac{1}{8}$ of the binary weight accorded to that pulse as dictated by Formula 3 above. In addition, each pulse can be increased by one unit of width as dictated by one of the three least significant bits which remain at the data input in a manner which will be described below.

Figure 4:
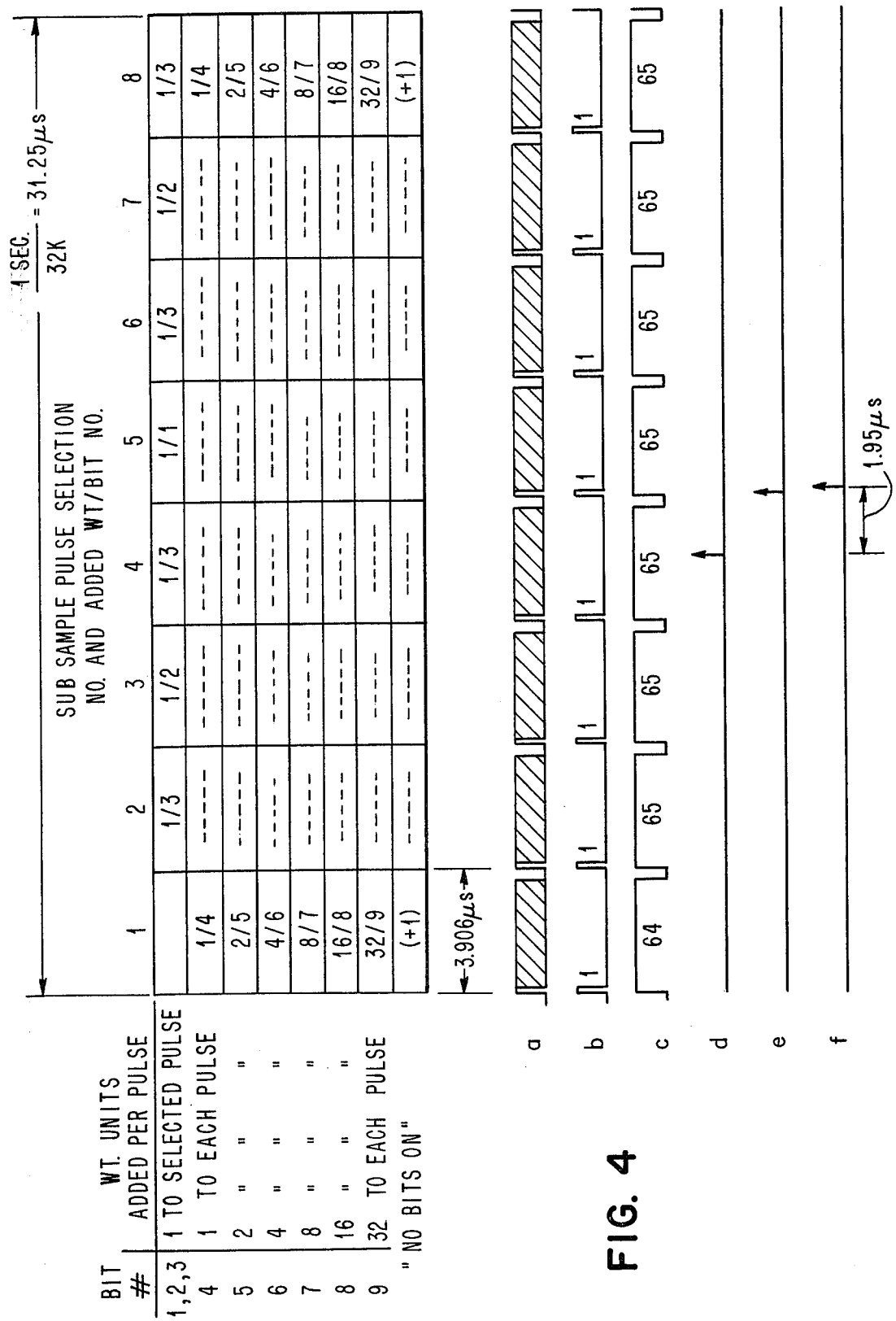
FIG. 4 illustrates an energy distribution versus pulse code or energy/slice assignment chart for the technique of the present invention.

Turning to FIG. 4, a schematic diagram illustrating the energy distribution in each sample time for a given 8 pulse implementation of the present technique is illustrated. In FIG. 4, the 8 pulses or sub-samples which comprise a given sample time are illustrated in columnar fashion across the top of the figure. A binary weight is assigned as defined by the binary value of the bit number so that each bit adds a number of time units or increments defined as a weight to each pulse as shown in the chart of FIG. 4. Bit Nos. 1, 2 and 3 each have been given a weighting value of one unit so that, if any of Bit Nos. 1, 2 or 3 is on, a single unit of width will be added to one or more of the various pulses in the given sample time. If Bit No. 1 is a 1, a unit of increase will be added preferably to Pulse No. 5. If Bit No. 2 is a 1, a single unit of increase will be added also to Pulses Nos. 3 and 7 and, if Bit No. 3 is a 1, the unit of increase will be added to Pulses Nos. 2, 4, 6 and 8 as illustrated in the chart. It will be observed that Bit No. 1, if it happens to be the lowest order bit in a binary data input, contributes only one unit of increase to a single pulse in the sample whereas Bit No. 2, the two's position in a binary number, such as might be applied at the data input, will add one unit of increase to two of the pulses in the sample time while Bit No. 3, the four's position in a binary code, adds one increment of width to four of the pulses in the sample time. It also will be noted that there is no overlap in width added to the pulses, which is essentially the technique of a pulse rate modulation approach. Bit No. 4, the eight's position in a binary code, adds eight units of increase distributed across each of the pulses in the sample. So also with the remaining Bit Nos. 5 through 9, if they happen to be set to one, increments of 16 through 256 respectively, may be distributed across the 8 pulses in the sample time (2 to 32 units per sub sample). It will be observed that this technique is essentially that of pulse width modulation applied to 8 slices or segments of a given sample time.

In the bottom of the chart portion of FIG. 4 is a line designated "no bit on" which represents a data input of all zeros and provides an output illustrated in Line B of FIG. 4 equal to 8 minimum width pulses. Line A illustrates the maximum range of variable width pulses which can be produced assuming a 9 bit code, and Line C illustrates a waveform output that would be produced for the maximum value of a 9 bit code.

Line D illustrates the effective center of the energy distribution in the sample of FIG. 4 where 0 is the data input and Lines E and F illustrate, respectively, the center of the energy distribution in the samples for encoding 511 (decimal equivalent) and 1. The maximum variation between the center of the energy distribution for 0 in Line D and for 1 in Line F is approximately 1.95 microseconds as shown, and thus lies centered very closely on the center of the total sample time so that the effective center of the energy distribution lies at the center of the sample time, plus or minus approximately 1 microsecond.

Figure 3:
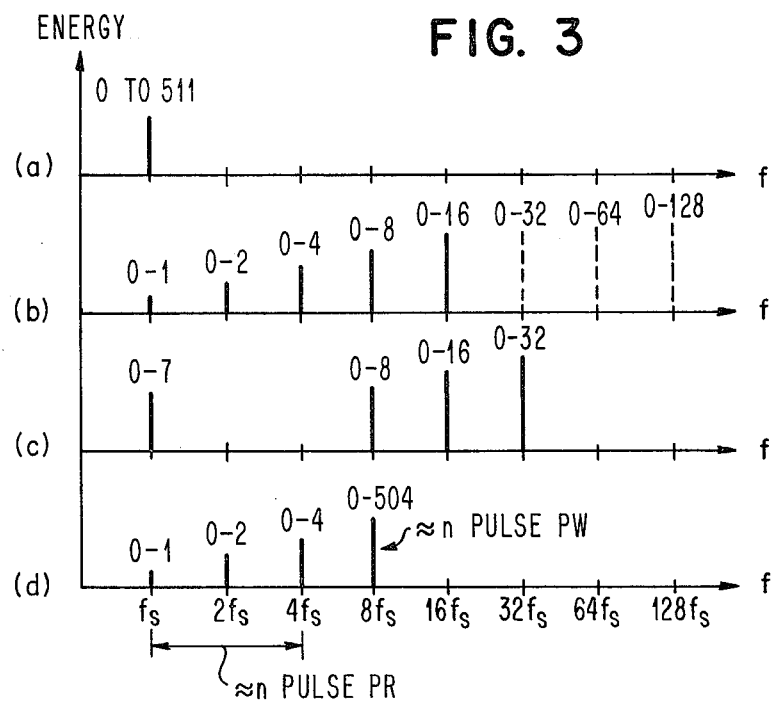
FIG. 3 illustrates a comparison of the energy versus frequency distribution spectra for various modulation techniques including the technique of the present invention.

Turning to FIG. 3, a schematic example of the energy distribution versus frequency spectrum for various types of digital-to-analog conversion techniques is shown.

FIG. 3, Line A illustrates the typical energy versus frequency distribution spectrum for a pulse width modulation technique and illustrates that the energy will all appear as a pulse varying as necessary from 0 width up to its maximum width to encode, for a binary input, values from 0 to 511 centered at assembling frequency $f_s$. Such a spectrum requires extremely accurate filters to remove the energy distribution component in the signal stream from being generated in analog form at the output of an integrator or filter as will be well understood to those of skill in the art.

Line B illustrates the effective energy versus frequency spectrum for the pulse rate modulation technique and it may be seen that very little energy is present at the sampling frequency $f_s$, but that increasing amounts of energy appear at twice, four times, eight times, etc., the sampling frequency. This approach avoids the necessity of having extremely high accuracy, high quality filters but does require very high switching performance in controlling the pulse generator for the digital pulse generation function.

Line C in FIG. 3 illustrates one prior art hybrid technique of digital-to-analog modulation in which, for example, the three low order bits are lumped together in a pulse width modulation function centered at the sampling frequency $f_s$ and the remaining energy is distributed for the higher order bits at eight times the sampling frequency, sixteen times the sampling frequency and higher, in a manner identical to that of the pulse rate modulation technique in FIG. 3, Line B. This approach is better than pulse width modulation alone such as illustrated in Line A, but still requires a good filter to remove a considerable amount of energy still remaining at the basic sampling frequency $f_s$ and does require the same type of high speed switching capability as the pulse rate modulation technique in Line B.

Line D of FIG. 3, however, illustrates the approach of the present invention in which the energy required for the three low order bits of the data input is distributed at the sampling frequency, two times the sampling frequency and four times the sampling frequency as is known for the pulse rate modulation approach, and all of the remaining energy is lumped at, for sake of example, eight times the sampling frequency in a technique similar to pulse width modulation. This approach utilizes a very simple filter and does not require the high speed switching circuits necessary for frequencies beyond eight to sixteen times the sampling frequency and avoids many of the problems in the prior art in a better manner than has been previously provided. The switching irregularities, if any, produce a DC offset voltage only as will be discussed below, which can be easily balanced out.

Figure 5:
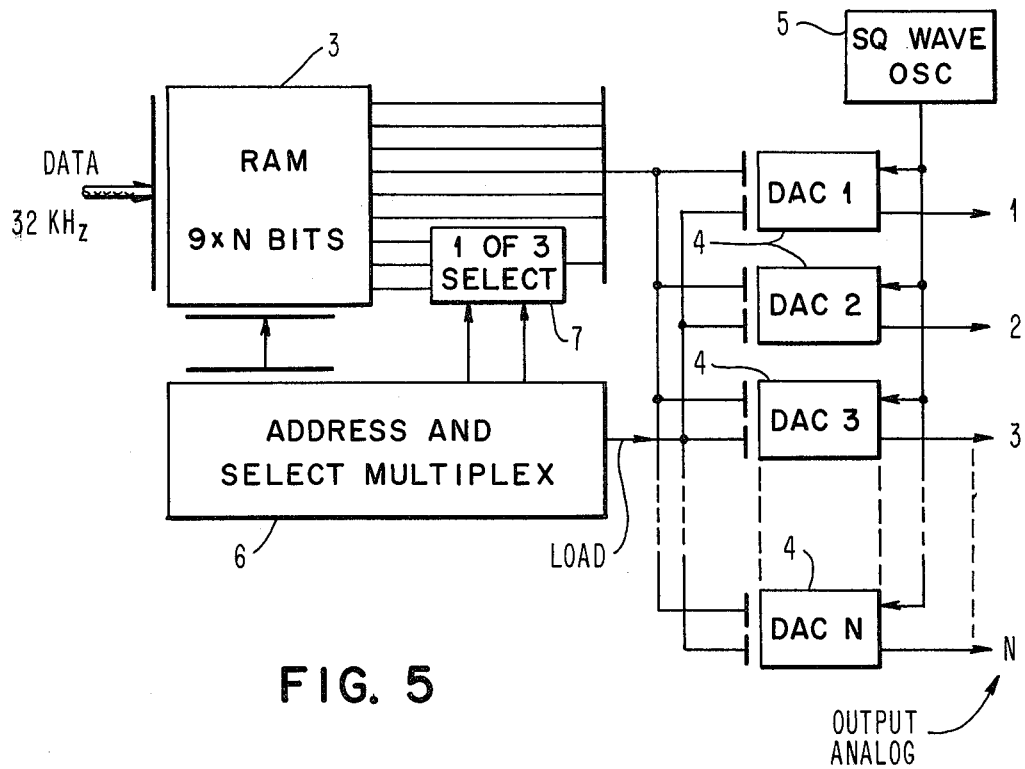
FIG. 5 illustrates in schematic form a block diagram for a multiple digital-to-analog converter apparatus constructed to operate utilizing the techniques of the present invention.

A preferred embodiment of the invention has been constructed for an application which requires a large number of digital-to-analog converters, one for each line or channel in a communications system. FIG. 5 illustrates the overall block schematic diagram of a multiple digital-to-analog converter system in which a random access memory 3 is utilized to store all of the data for each of N channels in a series of 9 bit sample words. This memory is addressed sequentially so that each data 9-bit word will be read to the appropriate digital-to-analog converter 4 eight times per sample. This avoids having a separate storage or buffer for each of the converters 4 and provides the appropriate input to the converters individually so that the 8 slices or sub-sample pulses to be produced per sample time can be constructed as was shown previously in FIG. 4.

The three low order bits of the 9-bit example given are selected from the memory 3 in accordance with which pulse in the 8 pulse format in a given sample is being processed and a selection address is fed to the converters 4 to control which converter should receive the data at a particular time. A square wave oscillator 5 provides the basic clocking signal to advance the counters in the digital-to-analog converters 4 as will be described below. The address generator and selection code generator 6 can be a simple binary counter, the low order bits of which access the memory 3 and the high order bits of which are utilized in a second set of selection gates 7 to access low order bits individually as illustrated in FIG. 5. The memory 3, the address and selection mechanism 6 and 7, and the square wave oscillator 5 are not shown in detail as these are not a portion of the present invention but merely show the implementation of multiple digital-to-analog converters according to the invention.

Figure 6:
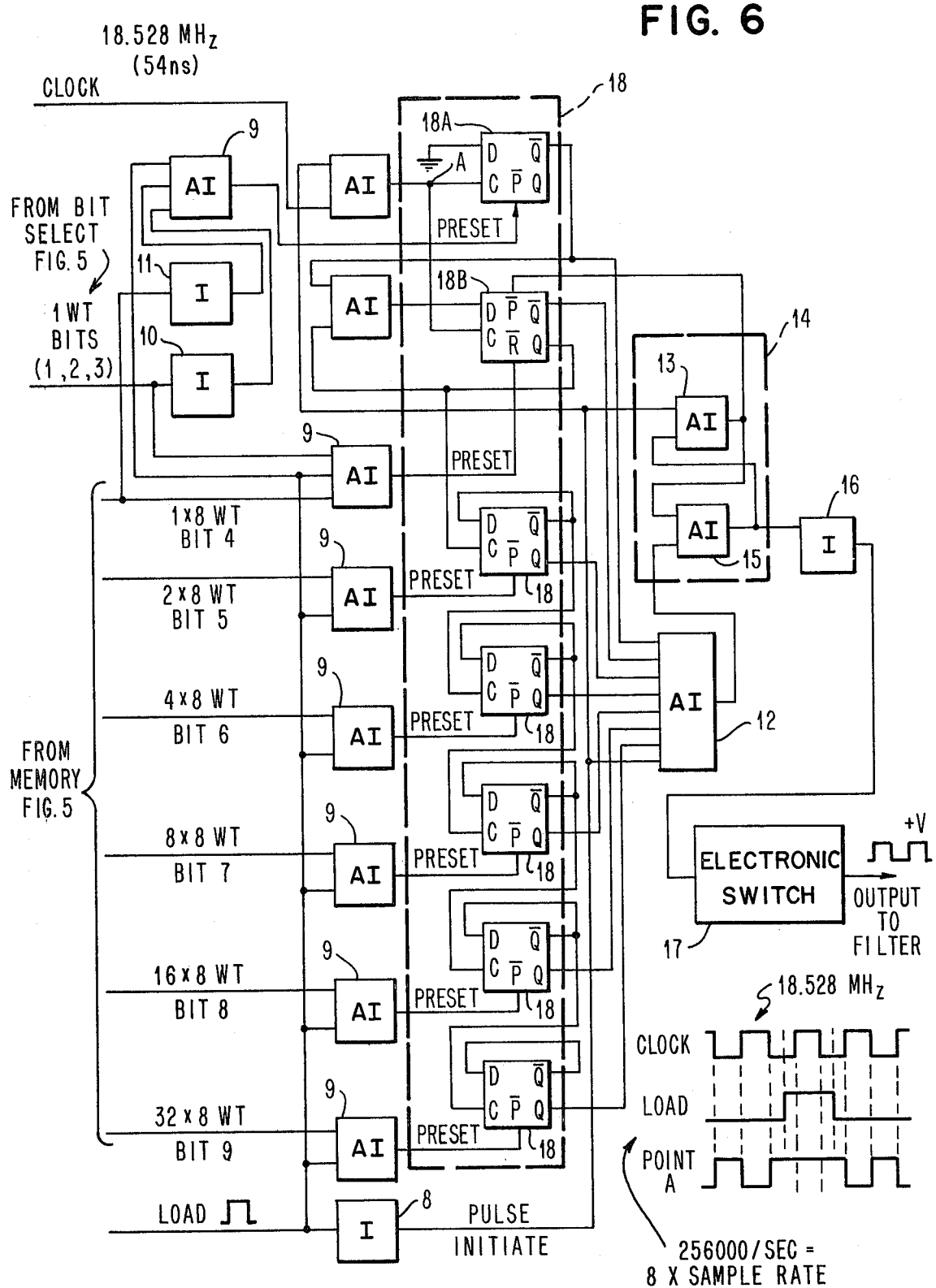
FIG. 6 illustrates in schematic form a preferred embodiment of the apparatus of the present invention.

FIG. 6 illustrates the circuitry of the preferred embodiment for a single digital-to-analog converter 4 as shown in FIG. 5.

In FIG. 6, the inverter 8 operates to produce a negative-going pulse initiate signal as output whenever positive-going load signals are applied at its input. This signal is utilized to initiate the pulse output from the converter by means which will be explained below. The pulse initiate signal has a duration of one complete clock cycle from the 18.528 megahertz system clock, but is staggered with relation to the clock signal as shown in the small timing chart at the bottom of FIG. 6. A suitable clock would be the equivalent of the square wave oscillator 5 in FIG. 5 and the frequency of oscillation is chosen to provide 8 load signals for every 31.25 microsecond (1/32KHz) sample time, thus producing an effective sample selection frequency of 256 kilohertz. The clocking frequency to produce this would be at least 16 to 20 MHz.

The load signal is applied to an entire series of separate inverting AND gates 9.

A pulse initiation signal is produced by the first inverter 8, which signal is applied to one of the inputs of an inverting AND gate 12 as a negative-going signal. The negative-going signal is also supplied to the input of one of the inverting AND gates 13 which is included in the pulse duration control latch 14, producing a positive output from gate 13 which is connected to inverting AND gate 15 to produce a negative-going output therefrom which is supplied to the input of the output inverter 16, thus turning it on and providing a turn-on signal to the high speed electronic switch 17 which provides the start of an analog voltage output pulse for subsequent integration and filtering to construct a portion of the desired analog wave. The high speed electronic switch 17 is of a type similar to many in the prior art and any of a variety of high speed electronic switches well known in the art of digital-to-analog converter designs may be applied.

Inverting AND gates 13 and 15 together form a pulse duration control latch 14 as noted above. Latch 14 is controlled by the output of inverting AND gate 12 so that, once it has been turned on by the input pulse to AND gate 13 which initiates an output pulse, latch 14 will remain in the set condition until all of the inputs to AND gate 12 are positive. This will not occur at least until the end of the load pulse period as shown in the small timing chart at the bottom right-hand corner of Figure. This load pulse, negative-going at the end of its duration, will, through the inverter gate 8, produce a positive-going signal to be applied to gate 12. When this occurs, a negative-going output will appear at the output of gate 12 and this will be applied to one of the inputs of gate 15, thus disabling gate 15 and producing a positive-going signal at its output that will be applied to inverter 16, turning if off. This will ordinarily produce an output pulse from the high speed electronic switch 17 which is of minimum duration equal to the minimum pulse width or increment of energy supplied by the clock.

This situation is illustrated in Line B of FIG. 4 where 8 minimum duration pulses are produced during the 8 individual selection times occurring during one of the 32 kilosample per second sample times. The minimum width stream of selection pulses during a sample time as illustrated in Line B of FIG. 4 represent an all zero data input. Other data bit inputs may be supplied from memory 3 in FIG. 5 to the inputs so labeled in FIG. 6 according to the binary bit position. The low order bits are sequentially supplied by the selection circuit 7 in FIG. 5 and are applied individually at different selection times to the input of inverter 10. The high order bits beginning with bit 4 and continuing through bit 9 are applied at the labeled inputs to the inverting AND gates 9 as shown in FIG. 6. Thus, if a given bit position contains a bit in the output data word from memory 3, each corresponding AND gate 9 to which a bit is fed will produce, at the coincidence of the load signal from the multiplexor 6 in FIG. 5, a coincidence of two positive-going pulses at each of the inverting AND gates 9 which is thus supplied with a pulse from memory 3 and a load pulse. Those AND gates 9 which are so enabled will produce a negative-going output pulse utilized for the preset function by which means a binary counter 18 is set to a count to be counted out to zero to time the duration of an output pulse during this segment (1 out of 8) in the sample being processed (1 out of 32 K per second).

The preset function signals are applied to the presetting inputs of the various stages of a 6 bit binary counter 18 constructed using typical D type flipflops such as the Type 7474 available commercially from most semi conductor companies. These flipflops are identified for the various binary bit positions that they service as the counter and are all numbered 18. Sections 18A and 18B are used to account for the extra increments that may be added in the frequency modulation type of encoding used for the three low order bits. The extra increment may be added to any of the 8 sub-sample pulse widths produced as shown in FIG. 4, and the control over which of the 8 sub-samples will receive the extra increments is controlled by the selector 7 in FIG. 5 as shown. Selector 7 may be simply a set of AND gates wired to permit only the selected 1, 2 or 3 position bit to be sent from memory 3 to the input of inverters 9 and 10 on FIG. 6.

As can be seen in FIG. 6, the basic timing of the length or duration of the final output pulse is dependent upon the time it takes for counter 18 to count down to the zero content. In operation, when the pulse duration output latch 14 is finally turned off at the end of the countdown period, a negative-going output signal is produced from inverter 13 which is applied to stage 18B of counter 18. This input to stage 18B of counter 18 is provided to the $\bar{P}$ input which sets the $\bar{Q}$ output to a negative level. This causes the Q output to go positive and to apply a clock signal to the next following stage of counter 18 and to set its Q output negative and its $\bar{Q}$ output positive which in turn applies a clock pulse to the following stage of counter 18 to set its Q output negative and its $\bar{Q}$ output positive, etc., in a ripple-down effect which sets all of the succeeding stages of counter 18 to the negative condition on those lines thereof which are connected to the inverter 12.

This has the effect of setting all of the stages of counter 18, except for the first stage 18A, to the zero condition so that, if the counter begins counting, it will take the maximum number of counts to count counter 18 all of the way through its cycle and thus will create, unless conditions in the counter stages are changed, the maximum duration output pulse from the electronic switch 17 at the next time an output pulse is begun. It will be observed that the various data bit inputs to the inverting AND gates 9 may be either plus or minus as they come from memory 3 in FIG. 5. By the logic convention adopted in FIG. 6, a negative level input corresponds to a 1 coming from memory 3 and will result in leaving that stage of counter 18 which is connected to the particular inverter 9 which receives the negative or 1 input in its condition just noted above in preparation for the maximum duration count. On the other hand, if a plus or zero input is received from memory 3, the particular inverter 9 to which it is applied will be fully activated and a negative-going output signal utilized as a preset signal will be applied to the $\bar{P}$ input of the associated stage of counter 18 to which that particular inverter 9 is connected. A negative-going input signal on a $\bar{P}$ input for the counter stages 18 has the effect of studying the $\bar{Q}$ output to a negative level and the Q output to a positive level. This, in effect, sets that stage of the counter to 1 so that only a single pulse of counting pulses need be applied to the counter to set it to transfer a pulse to the next succeeding stage. In this manner, the total duration of a final output pulse from switch 17 may be shortened by presetting individual stages corresponding to the various bit positions in the binary counter 18 to the 1 condition to shorten the timeout which will be produced when clock pulses are counted in the counter.

The operation of the circuit in FIG. 6 is self explanatory to one of skill in the art and the operation is such that, at the end of a countdown period, all of the inputs to inverter 12 except the top and the bottom ones as illustrated in FIG. 6 will be at a negative level and the top and bottom ones will be at a positive level (having passed through negative states somewhat earlier). The AND gate and inverter 12 will, therefore, have produced a negative-going signal just previously which will have resulted in a signal ending the countdown period and resetting the stages of counter 18 as noted above.

The circuit then awaits the next occurrence of a load pulse as illustrated in the small timing chart at the bottom right-hand portion of FIG. 6. Load pulses occur at eight times the sample rate so that 8 sub-sample pulses, each of which may be of different duration, will be produced during a sample time 32,000 of such samples occur per second in the preferred embodiment.

At the occurrence of the load pulse, inverter 8 will produce a negative-going signal which is applied to one of the inputs of inverter 13, switching its state and causing the latch 14 to provide a negative-going signal to the input of inverter 16, thus turning on the output with a positive level at the electronic switch 17 and initiating a next analog pulse output therefrom. At the same time that a load pulse is applied to inverter 8, the bit inputs to the inverter stages 9 will be sampled and the various counter stages 18 will be either left in their count-to-maximum state or preset to the minimum count state to shorten the timeout period as discussed above.

During the count cycle, the condition will eventually be reached where all of the stages of counter 18 have applied positive inputs to AND gate and inverter 12 which will result in resetting the latch 14 and ending the output pulse from electronic switch 17 and, as noted above, resets all of the other inputs to AND gate 12 to minus with the exception of the top and bottom ones in preparation for the next load and timeout cycle. This process is repeated eight times per sample at a rate of 256,000 output pulses per second from the electronic switch 17. It may be seen that the first stage of counter 18, stage 18A, will add a pulse to the minimum width with pulses which are always produced only when the bit inputs for both bit 1 and bit 4 are both on, in which case an additional unit of pulse width must be added in the output pulse according to the method of the invention as shown in FIG. 3. Stage 18A of counter 18 acts, in effect, like an extra one's position in the counter.

Having thus described my invention and a preferred embodiment thereof, it will be apparent to those of skill in the art that many other electrical circuits and apparatus modifications can be made without departing from the basic teachings of function and method contained herein, and, therefore.

What is claimed is:

1. In a digital-to-analog converter in which multi bit digital representations of instantaneously measured analog wave form voltages are received as inputs and from which it is desired to produce analog voltage outputs by controlling the total energy content of the output spectrum produced by an output voltage from a switched supply means, which waveform spectrum is applied to an integrator to reconstruct the desired analog waveform, the method of operating said converter comprising steps of:

allocating the total duration of a voltage output from
said switched voltage supply into n discontinuous periods of time, each of said periods having at least a minimum duration; and controlling the duration of each of said allocated discontinuous periods of time independently and in correspondence with the digital value of said received inputs, said periods being increased in duration over said minimum period by a number of said minimum sized increments the total number of said increments of increase being equal to the binary value of the totality of the high order bits contained in said multi bit digital input, said total incremental increase in duration being divided equally among said $n$ discontinuous periods;

and also increasing certain of said n discontinuous periods of time by one said minimum increment each, the number of said periods so increased being in correspondence with the binary value of the individual low order bits of said multi bit digital input.

2. The method as described in claim 1, in which: said high order bits are defined as equal to $B - \log_2 n$, where $B$ is the number of bits in said multi bit data input and $n$ is the number of said discontinuous periods of time chosen for the allocation of said total duration of voltage output; and said low order bits are defined as B minus said high order bits.

3. The method as described in claim 1, wherein:

the maximum number N of said minimum increments by which said periods can be increased is defined by $N = 2^B/n$, B being the number of data bits in said multi bit data input.

4. The method as described in claim 2, wherein:

the maximum number N of said minimum increments by which said periods can be increased is defined by $N = 2^B/n$.

5. The method as described in claim 1, wherein:

said increase in duration is equal to the sum of individual increases accorded to the binary value of the positions of the individual high order bits in the data input according to the formula; increase/bit = $2^{m-1}/n$ where $m$ is the number of a given high order bit and the high order bits are defined at $B - \log_2 n$ wherein B is the number of bits in said multi bit data input; and, in said certain periods of time which may be increased by one said minimum increment in correspondence with the low order bits in said multi bit data input, said low order bits being defined as B minus said high order bits, the total contribution of increase is equal to the binary value accorded to the position of the low order bit in said multi bit data input; and the number of said n discontinuous periods which are increased in duration by a given low order bit corresponds to the binary value of said low order bit.

6. The method as described in claim 2, wherein:

said increase in duration is equal to the sum of individual increases accorded to the binary value of the positions of the individual high order bits in the data input according to the formula; increase/bit = $2^{m-1}/n$ where $m$ is the number of a given high order bit and the high order bits are defined as B $- \log_2 n$ wherein B is the number of bits in said multi bit data input; and, in said certain periods of time which may be increased by one said minimum increment in correspondence with the low order bits in said multi bit data input, said low order bits being defined as B minus said high order bits, the total contribution of increase is equal to the binary value accorded to the position of the low order bit in said multi bit data input; and the number of said $n$ discontinuous periods which are increased in duration by a given low order bit corresponds to the binary value of said low order bit.

7. The method as described in claim 3, wherein:

said increase in duration is equal to the sum of individual increases accorded to the binary value of the positions of the individual high order bits in the data input according to the formula; increase/bit = $2^{m-1}/n$ where $m$ is the number of a given high order bit and the high order bits are defined as B $- \log_2 n$ wherein B is the number of bits in said multi bit data input; and, in said certain periods of time which may be increased by one said minimum increment in correspondence with the low order bits in said multi bit data input, said low order bits being defined as B minus said high order bits, the total contribution of increase is equal to the binary value accorded to the position of the low order bit in said multi bit data input; and the number of said n discontinuous periods which are increased in duration by a given low order bit corresponds to the binary value of said low order bit.

8. The method as described in claim 4, wherein:

said increase in duration is equal to the sum of individual increases accorded to the binary value of the positions of the individual high order bits in the data input according to the formula; increase/bit = $2^{m-1}/n$ where $m$ is the number of a given high order bit and the high order bits are defined as B $- \log_2 n$ wherein B is the number of bits in said multi bit data input; and, in said certain periods of time which may be increased by one said minimum increment in correspondence with the low order bits in said multi bit data input, said low order bits being defined as B minus said high order bits, the total contribution of increase is equal to the binary value accorded to the position of the low order bit in said multi bit data input; and, the number of said n discontinuous periods which are increased in duration by a given low order bit corresponds to the binary value of said low order bit.

9. Digital-to-analog signal converter apparatus in which multi bit digital representations of instantaneously measured analog waveform voltages are received for conversion into analog voltage level outputs by controlling the content of the energy spectrum from a switched voltage supply means providing a pulsed output voltage for application to an integrator to reconstruct the desired analog waveform, comprising:

means for controlling the total duration of output voltage provided by said switched supply to provide $n$ discontinuous periods of voltage output time for each said digital input sample, said $n$ periods of time each having at least a minimum duration; and means for independently controlling the duration of each of said discontinuous periods of time in correspondence with the digital input value received at said converter; and said means for controlling the duration of each of said $n$ output times extends the duration of each of said pulses in weighted proportion to the high order bits of said digital input and additionally extends certain of said $n$ output pulses is weighted proportion to the low order bits of said digital input.

* * * * *